(12) United States Patent
Villwock et al.

(10) Patent No.: US 8,587,239 B2
(45) Date of Patent: Nov. 19, 2013

(54) APPARATUS AND METHOD FOR SENSORLESS IDENTIFICATION OF ROTATING ELECTRICAL EQUIVALENT CIRCUIT PARAMETERS OF A THREE-PHASE ASYNCHRONOUS MOTOR

(75) Inventors: Sebastian Villwock, Pechbrunn (DE); Heiko Zatocil, Nuremberg (DE)

(73) Assignee: Baumuller Nurnberg GmbH, Nuremberg (DE)

( * ) Notice: Subject to any disclaimer, the term of this patent is extended or adjusted under 35 U.S.C. 154(b) by 197 days.

(21) Appl. No.: 13/205,687

(22) Filed: Aug. 9, 2011

(65) Prior Publication Data
US 2012/0038303 A1    Feb. 16, 2012

(30) Foreign Application Priority Data

Aug. 16, 2010   (EP) ..................................... 10172899

(51) Int. Cl.
*H02P 1/04*  (2006.01)
*H02K 17/00* (2006.01)

(52) U.S. Cl.
USPC .............. 318/400.32; 318/400.33; 318/727; 318/800; 318/807; 318/808; 363/149; 363/159; 363/164; 363/176

(58) Field of Classification Search
USPC ......... 318/727, 610, 805, 732, 799, 729, 808, 318/400.33, 400.32; 702/189, 57; 363/149, 363/155, 154; 323/293, 208, 234, 212
See application file for complete search history.

(56) References Cited

U.S. PATENT DOCUMENTS

| | | | | |
|---|---|---|---|---|
| 3,887,853 A | * | 6/1975 | Klein et al. | 318/801 |
| 4,484,128 A | * | 11/1984 | Jotten et al. | 318/805 |
| 4,967,134 A | * | 10/1990 | Losic et al. | 318/802 |
| 5,689,169 A | * | 11/1997 | Kerkman et al. | 318/807 |
| 5,929,400 A | * | 7/1999 | Colby et al. | 187/393 |
| 6,774,664 B2 | * | 8/2004 | Godbersen | 324/545 |
| 7,482,777 B2 | * | 1/2009 | Tomigashi | 318/807 |
| 7,499,290 B1 | * | 3/2009 | Mazzola et al. | 363/17 |
| 7,978,483 B2 | * | 7/2011 | Mazzola et al. | 363/17 |
| 2003/0146722 A1 | * | 8/2003 | Griepentrog et al. | 318/257 |
| 2008/0231246 A1 | * | 9/2008 | Sugie et al. | 323/284 |

FOREIGN PATENT DOCUMENTS

| | | |
|---|---|---|
| DE | 44 11 149 A1 | 2/1995 |
| EP | 0 704 709 A2 | 4/1996 |
| JP | 2001 103798 A | 4/2001 |

OTHER PUBLICATIONS

Villwock, Sebastian; Pacas, Mario; Eutebach, Thomas, Application of the Welch-Method for the Automatic Parameter Identification of Electrical Drives, 2005, pp. 1449-1454, Industrial Electronics Society, 31st Annual Conference of IEEE, Piscataway, NJ, USA.

\* cited by examiner

*Primary Examiner* — Rita Leykin
(74) *Attorney, Agent, or Firm* — Frank H. Foster; Kremblas & Foster

(57) ABSTRACT

Identification of electrical equivalent circuit parameters (15) of a three-phase asynchronous motor (09) without a shaft encoder. The method comprises—Assumption of a standstill position of the rotor (11);—Equidirectional test signal infeed $U_{1\alpha}$, $U_{1\beta}$ in $\alpha$ and $\beta$ in the stator axis direction of the asynchronous motor (09);—Measuring of a measuring signal $I_{1\alpha}$, $I_{1\beta}$ of the $\alpha$ and $\beta$ axial direction of the asynchronous motor (09); and—Identification of equivalent circuit parameters of the asynchronous motor (09) on the basis of the test signal voltages $U_{1\alpha}$, $U_{1\beta}$ and of the measuring signal currents $I_{1\alpha}$, $I_{1\beta}$; whereby the test signal feed allows the rotor (11) to remain torque-free. Determination of equivalent circuit parameters (15) of an asynchronous motor (09) as well relates to a motor control device (35), whereby the identified equivalent circuit parameters (15) can be used for the determination, optimization and monitoring of a motor control and for control of electrical drives.

12 Claims, 11 Drawing Sheets

State of the Art

APPARATUS AND METHOD FOR SENSORLESS IDENTIFICATION OF ROTATING ELECTRICAL EQUIVALENT CIRCUIT PARAMETERS OF A THREE-PHASE ASYNCHRONOUS MOTOR

The present invention starts from a method, a device, an apparatus and the use of a method for an identification of electrical equivalent circuit parameters of a three-phase asynchronous motor without a shaft encoder. Electrical equivalent circuit parameters make possible the characterization of a three-phase motor by electrical equivalent circuit components, so that the electrical behavior of the motor in operation can be imitated.

STATE OF THE ART

Various methods are known from the state of the art for determining the electrical behavior of a three-phase motor. As a rule, direct current tests, no-load tests and short circuit tests are carried out on a motor in order measure the electrical behavior in such operating scenarios and to be able to derive from them electrical operating behaviors for other operating instances. Typically, a so-called T-equivalent circuit is used to characterize the electrical behavior of an asynchronous motor in which circuit the stator- and rotor coil and/or the electrical stator- and rotor behavior is/are imitated by two ohmic resistances $R_1$, $R'_2$, two coil inductivities $L_{1\sigma}$, $L'_{2\sigma}$ as well as by a main inductivity $L_h$. The attempt is made to determine the magnitude of the concentrated structural part parameters of the T-equivalent circuit by direct current tests, no-load tests and short circuit tests, whereby as a rule only an estimation can be made in particular as regards the leakage inductivities. $L_{1\sigma}$, $L'_{2\sigma}$. The previously cited tests represent time range methods in which the motor moves and which require a drive of the motor in a test environment. During the short-circuit test the motor must be fastened, whereby the danger of overloading can result. In the no-load test the machine is operated in a freely rotating manner, whereby a mechanical overload can occur. During a direct current test ohmic stator resistance $R_1$ can be determined and during a short-circuit test two ohmic resistance $R'_2$ as well as the leakage inductivities $L_{1\sigma}$, $L'_{2\sigma}$ can be determined, whereby the danger of mechanical or electrical overloading can result. The main inductivity $L_h$ can be estimated on the basis of the no-load test.

In addition, the previously cited short-circuit tests, no-load tests and direct current tests take account in many instances of measuring results of mechanical sensors such as, for example, position sensors, angular sensors or speed sensors, in order to be able to derive a correlation of the operating behavior of the motor at different numbers of rotation.

FIG. 4 shows the T-equivalent circuit of an asynchronous motor as regards a single-phase observation, whereby the electrical operating behavior of the three-phase motor is estimated in a stationary operating case, i.e., at constant speed and load, with knowledge of the cited equivalent circuit magnitudes. The parameter s characterizes the slip, i.e., the lag of the rotating rotor in contrast to the rotating magnetic field of the stator. This can determine the admittance of the motor in the operating behavior, which yields the following equation:

$$G = \underline{Y} = \cfrac{1}{R_1 + sL_{1\sigma} + \cfrac{sL_h \cdot (R'_2 + sL'_{2\sigma})}{R'_2 + s \cdot \underbrace{(L_h + L'_{2\sigma})}_{=L_2}}}$$

$$G = \underline{Y} = \frac{sL_2 + R'_2}{s^2(L_{1\sigma}L_2 + L_h L'_{2\sigma}) + s(L_1 R'_2 + L_2 R_1) + R_1 R'_2}$$

$$G = \underline{Y} = \frac{a_1 s + a_0}{b_2 s^2 + b_1 s + b_0}$$

with $a_0 = R'_2$, $a_1 = L_2$, $b_0 = R_1 R'_2$, $b_1 = (L_1 R_2 + L_2 R_1)$, $b_2 = (L_{1\sigma}L_2 + L_h L'_{2\sigma})$.

The above-cited admittance as transfer function $G = \underline{Y} = I_1/U_1$ is derived under the assumption of a slip magnitude $\overline{s}$ of 1, i.e., standstill. By the way, "s" does not designate the slip in the formula but rather the complex frequency in the Laplace range. The determination of parameters in the no-load test, short-circuit test and direct current test is based on this T-equivalent circuit. Regarding a more complicated consideration in an α/β or d/q-coordinate system of the motor voltages and motor currents presented later, the same equivalent circuit parameters can be taken into account; this manner of consideration not only allows a stationary characterization of the motor but makes possible a description of the dynamic behavior.

In a three-phase system in a Y or Δ circuit the current results by feeding two phases according to the rule $I_u + I_v + I_w = 0$ with lacking star point grounding. For this reason a three-phase system can also be described with two coordinates, whereby in order to describe the total current a coordinate system can be considered in the complex plane in which the two coordinates real part and imaginary part can be designated as α and β coordinates as regards the stationary alignment of the stator windings according to FIG. 1. The α/β coordinate system describes, for example, the direction of the current flux or the rotor flux axis in the resting reference system of the stator of the three-phase motor. As regards the magnetic alignment of the rotor, a second rotating coordinate system can be introduced whose axes are designated as the d-axis and the q-axis of the rotor, as is shown in FIG. 2. The d-axis designates the direction of the rotor flux and the q-axis designates the transverse flux axis at a right angle to it. An alignment of the stator magnetic field in the direction of the d axis of the rotor brings about quasi the determination of the rotor, whereas the stator magnetic field alignment in the direction of the q-axis of the rotor brings about a torque on the rotor. A transformation of α/β stator coordinate system into the rotating d/q rotor coordinate system can be brought about via the angle of rotation $\beta_k$ between the winding axis of the phase U of the stator and between the longitudinal axis of the rotor magnetic field. In this regard a total motor current I or its three-phase currents $I_U$, $I_V$ and $I_W$ can be considered in the stator-fixed α/β coordinate system or in the d/q-coordinate system rotating with the rotor. As regards the conversion of the phase currents of the three-phase asynchronous motor into the α/β coordinate system, the following relationship applies:

$$\begin{pmatrix} i_\alpha \\ i_\beta \end{pmatrix} = \begin{pmatrix} 1 & 0 & 0 \\ 0 & \frac{\sqrt{3}}{3} & -\frac{\sqrt{3}}{3} \end{pmatrix} \begin{pmatrix} i_u \\ i_v \\ i_w \end{pmatrix},$$

$$\begin{pmatrix} i_u \\ i_v \\ i_w \end{pmatrix} = \begin{pmatrix} 1 & 0 \\ -\frac{1}{2} & \frac{\sqrt{3}}{2} \\ -\frac{1}{2} & -\frac{\sqrt{3}}{2} \end{pmatrix} \begin{pmatrix} i_\alpha \\ i_\beta \end{pmatrix},$$

that can be modified by taking into account the rotor flux angle $\beta_k$ for the d/q coordinate system. For the following mathematical detection of the relationships a consideration is carried out in the $\alpha/\beta$ stator coordinate system according to FIG. 2, whereby the T-equivalent circuit shown in FIG. 4 describes an equivalent circuit characterization of the three-phase asynchronous machine in a single-phase system with feed voltages- and currents $U_1$, $I_1$ as well as $U_2$, $I_2$.

Starting from the phase voltages $U_U$, $U_V$ and $U_W$ and phase currents $I_U$, $I_V$ and $I_W$, they are transformed in accordance with the above transformation into the $\alpha/\beta$ coordinate system. Thus, the electrical behavior of the three-phase asynchronous machine can be considered with the aid of the input magnitudes $U_1$ or $U_2$ and output magnitudes $I_1$ or $I_2$. In this regard, separate ways of consideration can be carried out as regards the $\alpha$ and $\beta$ coordinates, so that four transmission functions respectively admittances can result:

$G_1 = I_{1\alpha}/U_{1\alpha}$, $G_2 = I_{1\beta}/U_{1\alpha}$, $G_3 = I_{1\alpha}/U_{1\beta}$, $G_4 = I_{1\beta}/U_{1\beta}$.

In the case of an identical feed in the $\alpha$ and $\beta$ axial direction and determination and comparison of the transmission functions $G_1$, $G_2$, $G_3$ or $G_4$, that have the same transmission characteristics given the basically identical and symmetric equivalent circuit, a verification of an analysis result can be achieved. It can be advantageously conceivable to this end to vary the height of the test signal $U_{1\beta}$ and to carry out parameter identifications with changed voltage values, whereby the resulting parameters can be determined as the average or the weighted parameter from the results of the individual parameter identifications. In this manner errors in the determination can be reduced, so that a more precise result can be achieved.

The use of a pseudo-noise binary signal (PRBS) as electrical test activation is known from the state of the art for determining mechanical characteristics of a three-phase motor, in particular for diagnosing the errors of mechanical parts or for mechanical system identification during operation in a mechanical connection. The mechanical system constitutes an SISO system here (Single-Input Single-Output) in which a single mechanical output magnitude can be measured with the aid of a single mechanical or electrical input magnitude. The input magnitude is excited with the aid of the pseudo-noise binary signal so that a broadband behavior of the SISO can be determined in the output magnitude. Characteristics of the mechanical system can be derived with the aid of signal-theoretical methods of frequency transformation and parameter identification using the frequency behavior given knowledge of the basic system equation.

However, in the case of electrical characteristics a so-called MIMO system (Multiple-Input Multiple-Output) is involved in which several input magnitudes (phase voltages) must be fed in several output magnitudes (these currents) must be extracted. For this reason the methods known from the process for the identification of mechanical magnitudes cannot be used for the electrical system characterization of a three-phase motor. The identification of the mechanical system is comprehensively described in the dissertation of Sebastian Villwock "Identifikationsmethoden für die automatisierte Inbetriebnahme und Zustandsüberwachung elektrischer Antriebe" ["*Identification Methods for the Automated Starting and Status Monitoring of Electrical Drives*"], University of Siegen, 2007, (publication [1]). Furthermore, a signal-theoretical method for the parameter identification of the mechanical system which method is used in this regard is described in the journal contribution: S. Villwock, J. M. Pacas: "Application of the Welch-Method for the Identification of Two and Three Mass Systems", IEEE Transactions on Industrial Electronics, Vol. 55, No. 1, January 2008, pp. 457-466 (publication [2]). A method which is generically similar was presented in the framework of a conference article in: P. Szczupak, J. M. Pacas: "Automatic Identification of a PMSM Drive Equipped with an Output LC-Filter", IEEE Industrial Electronics, IECON 2006, $32^{nd}$ Annual Conference on November 2006, pp. 1143-1148 (publication [3]).

The present invention has the problem, starting from an electrical T-equivalent circuit of a three-phase asynchronous machine, of suggesting a method for determining the equivalent circuit characteristics, whereby a parameter identification becomes possible without electrical or mechanical loading of the motor, the rotor stands still and all electrical equivalent circuit parameters can be determined by a single measurement for a description of the electrical behavior of the three-phase motor for a large frequency range. Advantageous further developments of the invention are subject matter of the subclaims.

DISCLOSURE OF THE INVENTION

In a first aspect of the invention a method without shaft encoder for the identification of electrical equivalent circuit parameters of a three-phase asynchronous motor is suggested that comprises at least the following steps:

Assumption of a standstill position of the rotor

Equidirectional test signal infeed $U_{1\alpha}$, $U_{1\beta}$ in $\alpha$- and $\beta$- in the stator axis direction of the asynchronous motor Measuring of the measuring signal $I_{1\alpha}$, $I_{1\beta}$ of the $\alpha$- and $\beta$-axial direction of the asynchronous motor Identification of equivalent circuit parameters of the asynchronous motor on the basis of test signal voltages $U_{1\alpha}$, $U_{1\beta}$ and of measuring signal currents $I_{1\alpha}$, $I_{1\beta}$; whereby the test signal feed into the asynchronous motor takes place in such a manner that the rotor remains torque-free.

A standstill position of the rotor means that the angle of the rotor does not change in comparison to the stator and thus the angle of rotation between the $\alpha$- and d-axis is constant and possibly known. After the assumption of a standstill position of the rotor a test signal is fed in equidirectionally in both axial directions, i.e., in the $\alpha$-axial direction and in the $\beta$-axial direction. The structure of the test signal determines which frequency components or frequency areas can be measured and with which accuracy the equivalent circuit parameters can be identified, whereby parameters corresponding to the frequency cover of the test signal can be extracted. A feeding in of the test signal voltages $U_{1\alpha}$ and $U_{1\beta}$ generates measuring signal currents $I_{1\alpha}$ and $I_{1\beta}$ that are measured. The feeding in of the two phase voltages for measuring the two-phase currents can take place, for example, by means of a 2/3-phase converter which, following the above matrix relation, can generate the three phase voltages $U_U$, $U_V$ and $U_W$ from the two voltages $U_{1\alpha}$ and $U_{1\beta}$ and can transform the two currents $I_{1\alpha}$ and $I_{1\beta}$ from the three measured currents $I_U$, $I_V$ and $I_W$. A feeding in of the test signal can take place, for example, by controlling an inverter of the motor control apparatus of the three-phase motor. Alternatively, the test signal voltage can be fed directly into the phases of the asynchronous machine.

The measuring of the phase currents can take place via the same current measuring instruments used in a regulating without a shaft encoder in the operation of the three-phase motor. In the time range the fed-in test signal voltages and the measured measuring signal currents can be recorded as digitally detected scanning values in time and the equivalent circuit can be extracted on their basis. This preferably takes place by a frequency range analysis, i.e., a frequency transformation of the recorded time range data, and of an analysis of the frequency response of the measured transmission functions $G_1$, $G_2$, $G_3$ or $G_4$. Given knowledge of the previously cited admittance function, that can be represented as a transmission function in the frequency range, the coefficients of the transmission function can be determined by a suitable signal-theoretical method, whereby these coefficients can be used to identify the equivalent circuit characteristics $R_1$, $R'_2$, $L_{1\sigma}$, $L'_{2\sigma}$ and $L_h$.

During the equidirectional feeding of the test signal in α- and β-coordinate directions, no torque is produced in the machine, so that the rotor remains free of torque and in its position. As a result thereof, a measurement can be carried out during the standstill of the motor, whereby no sensor data needs to be taken into consideration and even the parameters of a motor can be subsequently extracted in the installed state in a mechanical drive train without the type of the drive train influencing the measured results. As a result of the fact that both α/β inputs of the model receive the same test signal, the resulting inner torque of the machine turns out to be 0, because the following is valid:

$$M_{mi} = \frac{3}{2} p \mathcal{J} \{\vec{\Psi}_1^{s*} \vec{I}_1^s\}$$

$$M_{mi} = \frac{3}{2} p \mathcal{J} \{(\Psi_{1\alpha} + j\Psi_{1\beta})^* \cdot (I_{1\alpha} + jI_{1\beta})\}$$

$$M_{mi} = \frac{3}{2} p (\Psi_{1\alpha} I_{1\beta} - \Psi_{1\beta} I_{1\alpha})$$

A determination of the frequency response of the transmission function G with knowledge of the admittance formula $\underline{Y}$ forming the base makes possible the extraction of the equivalent circuit parameters. Thus, statements about the equivalent circuit characteristics of the three-phase motor can be made by feeding in an especially broadband test signal with a single measurement. For this, signal-theoretical methods are used that transform the measured time area data into frequency range data, whereby the frequency response can be detected with formulas and the coefficients of the basic transmission function and therewith the equivalent circuit magnitudes can be identified by a parameter extraction from the frequency response.

Basically, instead of a set test voltage and a measuring current determination, a setting of test current with detection of the measured voltage can take place. However, in particular powerful motors have a highly inductive behavior so that in order to impress rectangular current switching impulses high driver voltages must be applied, as a result of which an impressing of test current is only possible with great expense.

According to an advantageous further development of the invention at least one, in particular all frequency response functions $G_1 = I_{1\alpha}/U_{1\alpha}$, $G_2 = I_{1\beta}/U_{1\alpha}$, $G_3 = I_{1\alpha}/U_{1\beta}$, $G_4 = I_{1\beta}/U_{1\beta}$ are determined in order to identify the equivalent circuit parameters, whereby a deviation of the frequency response functions of $G_1$, $G_2$, $G_3$ and/or $G_4$ can bring about a repetition of the method or an error signal. Basically, the four admittance functions have an identical frequency behavior and yield the same parameters since the basic equivalent circuit comprises symmetric components and contains identical resistors and inductivity values. Thus, given the presence of all four characteristics, four transmission functions (admittances) are extracted, whereby in case of a deviation of the four admittances an inexactitude of the method sequence can be concluded. For example, the rotor can not yet be in standstill or errors can have occurred in the Fourier transformation, for example, too few or too long signal sequences were fed in or the test signal has no uniform frequency spectrum. In this case a difference results between the frequency courses, according to which a repetition of the method can be carried out, or an error signal can be emitted that can also indicate a defect of the asynchronous motor.

According to an advantageous further development, for example, the test signal can be a pseudo-noise binary signal. The test signal should have a high bandwidth in order to make possible the highest possible frequency resolution and a broadband analysis of the electrical motor behavior. White noise has a uniformly distributed broadband frequency spectrum. A pseudo-noise binary signal (PRBS) is a binary signal that approximates the spectrum of white noise. It can typically assume the values +1 and −1 and is used alternatively to white noise. In particular, the reproducibility of the signal is advantageous, whereby a PRB signal is frequently used in regulating technology for the analysis of an impulse response by means of a maximum length sequence. A PRB test signal can be readily generated by linear feedback shift registers and can be produced, for example, by a DPS (Digital Signal Processor), FPGA (Field Programmable Gate Array) or microcontrollers of a motor regulator for controlling the inverter. Thus, every motor control electronic system can generate such a PRB signal without great modification and feed it in as motor voltage into the motor.

Basically, a frequency range transformation of scanned time range data can take place as desired for the identification of the equivalent circuit parameters in the frequency range. According to an advantageous further development of the invention the identification of the equivalent circuit parameters can comprise a Fourier transformation in accordance with a periodogram method, preferably a Bartlett method, in particular a Welch method. A spectral power density is achieved in the framework of a periodogram method by a Fourier transformation of individual data blocks. The quality of the spectral estimation can be improved in that a number of periodograms that are independent of each other are averaged. This method is known in the literature under the name of Bartlett method, in which the measured signal is divided into sections. The Welch method represents an expansion of the procedure suggested by Bartlett. Certain window functions can be used here to reduce the leakage effect. The disturbing leakage effect occurs when the signal section is not periodic, a whole multiple of the period or when this signal section is on the edges of zero. The use of a Welch method in the identification of a system of two or of three units is already known from the above-cited publication [2]. The Welch method splits M scanning values into K partial sequences that are weighted with a window function and is applied to a Fourier transformation. The Welch method described in the publication [1] makes possible the transformation of any number of scanning values with the greatest possible accuracy into the frequency range. The time range data is windowed here, the windowed data divided into partial sequences and Fourier-transformed and periodograms are determined from this that can be used to determine the transmission function, in this instance the admittance function, in the frequency range.

However, alternatively to the above, a correlogram method, also known in the literature under the name Blackman-Tukey estimation, can be used. Here, the spectral estimation takes place on the basis of an autocorrelation function (AKF) and a cross correlation function (KKF) that is calculated from the test signal (excitation signal) and from the measured signal (response signal). In this formulation the spectral power density is obtained by Fourier transformation of the previously estimated AKF and KKF. However, the Welch method furnishes more robust results.

Starting from the presentation of unknown transmission function present in the frequency range, for example, of the admittance course, the equivalent circuit parameters of the three-phase motor can be extracted. There are already a few numeric attempts to this end. The Levenberg-Marquardt algorithm can be used with particular advantage in a further development of the invention in order to identify the equivalent circuit parameters by a determination of the transmission function parameters. Alternatively, for example, a method according to Nelder and Mead can be used whereby, however, the Levenberg-Marquardt algorithm furnishes more robust results, in particular in the case of data records with a lot of noise. It belongs to the group of gradient methods, whereby better parameter vectors corresponding to the coefficients of the transmission function can be calculated by iterative minimizing of an error function. The Levenberg-Marquardt method is considered at the present as the standard method for non-linear optimizations. It is a mixture of gradient methods and inversion of a Hesse matrix and is also designated in the literature as the method with steepest descent. The inversion of the Hesse matrix is also designated as the Gauss-Newton method. A detailed presentation of the use of the Levenberg-Marquardt algorithm is presented in publication [1], whereby starting from a transmission function:

$$G = Y = \frac{a_1 s + a_0}{b_2 s^2 + b_1 s + b_0}$$

and with a pattern of the frequency response of the system, the unknown coefficients $a_0$, $a_1$, $b_0$, $b_1$ and $b_2$ can be determined. In comparison to the above-cited admittance presentation, these coefficients correspond to the parameters:

$a_0 = R'_2, a_1 = L_2, b_0 = R_1 R'_2, b_1 = (L_1 R'_2 + L_2 R_1), b_2 = (L_{1\sigma} L_2 + L_h L'_{2\sigma})$.

Therefore, the equivalent circuit parameters $L_{1\sigma}$, $L'_{2\sigma}$, $L_h$, $R_1$ and $R'_2$ can be determined by determining the unknown coefficients $a_0$, $a_1$, $b_0$, $b_1$ and $b_2$.

According to an advantageous further development of the invention the identified equivalent circuit parameters can be used in an adjustment and/or optimization of inverter control parameters at least for motor monitoring. In the regulating of modern asynchronous machines motor control apparatuses are used that can control the inverter accordingly given rapid speed changes or when making available dynamically regulatable output energy based on the knowledge of the electrical equivalent circuit parameters, and can set the phase drive voltages in such a manner that the machine can optimally meet the desired work tasks without overshootings. In this connection the concepts control and regulation are used synonymously. The knowledge of the equivalent circuit parameters of the electrical stretch can consequently serve for the parameterization of the current regulator, whose requirement for a high dynamic range is the greatest as the innermost regulator. In particular, demanding regulating methods that go beyond those of conventional PI regulators require a very precise knowledge of the machine parameters, in particular of the equivalent circuit parameters. In particular state space regulators, dead-beat regulators or model sequence regulators are to be cited here. Since in particular senssorless motor controls are being used in recent times, the equivalent circuit parameters of three-phase motors that are already integrated or replaced in the mechanical drive line in a complex machine environment can be determined by means of the suggested method without shaft encoder and the motor regulator can be adjusted on site. The description of the electrical behavior during dynamic processes is possible by means of the equivalent circuit parameters, so that in particular during the regulation of complex transient transition processes of the machine a precise controlling of the inverter becomes possible. A regulator adjustment free of overshootings and an optimized rapid dynamic regulation of the motor becomes possible here. In particular, the use of such an optimized motor regulation is conceivable given precise knowledge of the equivalent circuit parameters in the area of printing machines, machines for producing and working plastic surfaces or of roller and packaging machines in which dynamic-optimized motor control methods must be used. In particular in the case of four-color printing machines the slightest deviations in the color printing are recognizable in motor control inaccuracies. In the production of extremely smooth and thin plastic surfaces a uniform thickness of the plastic layer can only be achieved with optimal regulation of the dynamic range, whereby no optical impurities of the plastic material can occur. During the analysis of the equivalent circuit parameters the rotor is resting in standstill and can therefore be electrically identified in the assembled state without influence of the output line. A regulator parameterization serves to optimize the control parameters of the inverter, whereby a deviation of the equivalent circuit parameters from, for example, previous measurements can be taken into account for the error monitoring of the motor or for controlling wear. In particular, the use of the method in the framework of a condition monitoring of the motor can be advantageous, so that from time to time the method can re-determine the equivalent circuit parameters, adaptively adapt the rotor regulator and can emit an error signal in the case of noticeable deviations from previously identified or presettable parameter values, so that the motor or control electronics can be checked.

According to a coordinate aspect of the invention an identification apparatus is suggested for the identification without a shaft encoder of electrical equivalent circuit parameters of a three-phase asynchronous motor which apparatus is suitable for carrying out a method in accordance with one of the previously cited exemplary embodiments. The identification apparatus comprises to this end an inverter interface unit that can be connected to an inverter control apparatus for the controlling communication and for determining the rotor standstill. The identification apparatus is characterized in that a test signal generation apparatus for generating an α/β-test signal, a U/V/W-transformation unit for the transformation of the α/β-test signal into a U/V/W-control test signal, an α/β-transformation unit for the transformation of measured U/V/W-measured signal currents into α/β-measured signal currents and a parameter identification unit for the different of equivalent circuit parameters are comprised.

Thus, this invention relates to an identification apparatus that is designed for performing a previously cited method and opens up the possibility to this end of communicating by an inverter interface unit with an inverter control apparatus, in particular with the semiconductor components of the inverter, in order to switch them or to query their operating state. A standstill of the rotor can be determined by deactivating the inverter and/or activating a brake for a considerable time. In addition, for example, speed- or shaft encoder sensors can supply information about a standstill of the rotor. However, these sensors are not required for parameter identification, a heuristic knowledge about an assumed rotor standstill can suffice in most instances. The identification apparatus comprises a test signal generation apparatus that can generate a two-channel, identical α/β-test signal, whereby the test signal, in particular a PRB noise signal, can be converted by a U/V/W-transformation unit into a U/V/W-control test signal that can be supplied to the inverter control apparatus. In the motor the control test signal generates corresponding test signal voltages in the three motor phases. Furthermore, the identification apparatus comprises an α/β-transformation unit that can convert the measured $I_U$, $I_V$ and $I_W$-measured signal currents into α/β-measured signal currents $I_\alpha$ and $I_\beta$ and comprises a parameter identification unit that, starting from the test signal voltages $U_\alpha$, $U_\beta$ present in the time range and from the measured signal currents $I_\alpha$, $I_\beta$, can carry out a parameter identification according to previously cited methods. Such an identification apparatus can be constructed, for example, in a multipartite manner, whereby a motor control apparatus can be used to generate the test signal of the motor controller. The measured currents can also be recorded by the motor control apparatus. An external computer can read out these measured and supplied voltages and currents, transform them into the frequency range and carry out a parameter identification.

According to an advantageous further development of the identification apparatus the parameter identification unit can comprise a Fourier transformation means, in particular an FFT/DFT means for the Fourier transformation of discontinuous α/β scanning signal values according to the Welch method and comprise a parameter determination means, in particular a Levenberg-Marquardt transmission function-parameter determination means. Accordingly, the parameter identification unit comprises a Fourier transformation means for transferring the supplied and measured voltage- and current time scan values $U_{1\alpha}$, $U_{1\beta}$, $I_{1\alpha}$, $I_{1\beta}$ and comprises a parameter determination means that, starting from transformation functions $G_1$, $G_2$, $G_3$ and or $G_4$, present in the frequency range, can carry out a determination of the transformation function coefficients $a_0$, $a_1$, $b_0$, $b_1$ and $b_2$. The computer processes necessary for this can be performed, for example, in a DSP, a microcontroller of an FPGA, in a PC or a small computer, whereby a logical and structural separation between test signal generation, measured value storage, Fourier transformation and parameter determination is possible. The signal processing and the subsequent numeric process can advantageously be provided as software implementation at least partially on a motor regulator or motor control apparatus.

Thus, it is conceivable to build the Fourier transformation means up as FPGA in order to realize a rapid Fourier transformation with the aid of a static switching circuit, and to implement the parameter identification means as variable calculating software on a high-performance DSP of a motor control regulator. A test signal production and measured value storage can be carried out in an inverter motor control device. Fourier transformation and parameter identification can also take place by a motor control device or by an external identification apparatus that comprises an interface to the communication with the motor control device. Thus, the motor control device can be provided with low calculating power, and demanding signal-theoretical tasks can be processed in an external identification apparatus that can be connected to the motor control device, as a result of which hardware expense can be saved.

According to an advantageous further development the apparatus can furthermore comprise a monitoring and optimization unit that is set up to determine, optimize and/or monitor control parameters of an inverter control apparatus on the basis of the identified equivalent circuit parameters. The monitoring and optimization unit receives the determined equivalent circuit parameters of the parameter identification unit and can optimize control parameters of the motor control device on the basis of determined equivalent circuit parameters, in particular as regards a dynamic regulator behavior and/or filter properties in order to reduce the effects of the inductive behavior of the asynchronous motor on the mains. Furthermore, an efficient operation of the motor control can be optimized and motor changes monitored and/or an error signal can be emitted in the case of a motor failure or erroneous behavior. The equivalent circuit parameters required for this can be routinely carried out after a certain time interval or, for example, when replacing the motor or motor parts again in the framework of a conditioning monitoring by the monitoring and optimizing unit.

In a coordinate aspect the invention suggests a motor control device for the shaft-encoderless control or regulation of a three-phase asynchronous motor that comprises a previously described identification apparatus for the shaft-encoderless identification of electrical equivalent circuit parameters, whereby the identified equivalent circuit parameters can be used for the determination, optimization and monitoring of the motor and/or of the motor control. Thus, this aspect suggests a motor control device or motor regulating device that can perform in a customary manner a sensor-based or shaft-encoderless control or regulation of the speed behavior of the asynchronous motor and that comprises an identification apparatus or communicates with such an identification apparatus, and that uses the identified equivalent circuit parameters for the optimization of the regulating behavior, for the determination of electrical magnitudes for the control of the motor and for the monitoring of an error-free behavior of the asynchronous motor and/or of the motor control. Thus, the determined equivalent circuit parameters can serve for the optimal adjustment of control characteristics so that a dynamic regulatory behavior can become possible without overshootings. Thus, the identified parameters can be used for the optimization of the current consumption and of the energy efficiency of the asynchronous motor and be used, for example, for a filter parameterization for adjusting electronic filters, or they can be used for monitoring the error-free behavior of the motor control device and/or of the asynchronous motor. In the case of a predeterminable deviation of the identified parameters in contrast to previously determined or given equivalent circuit parameters an instance of an error can be assumed or a new determination of the equivalent circuit parameters carried out. In the case of a repair order the replacement of the motor the motor control device can adaptively identify the equivalent circuit parameters of the new motor and adjust itself in an optimal fashion to the new motor. Such a self-calibration of the motor control device can take place in the workplace or during the assembly of the machine at the customer's or in the running operation in the framework of a condition monitoring.

An advantageous further development suggests that the motor control device is arranged in such a manner that an automated identification of the equivalent circuit parameters during about a rotor standstill can be carried out at least during the first startup, preferably several times in the course of the service life, whereby an error signal can be initiated upon a demonstrable deviation of the identified equivalent circuit parameters from previously determined, stored and/or model-related equivalent circuit parameters. Thus, this aspect suggests that a parameter identification is carried out at least upon a first-time startup or upon a test run in the workplace but preferably in the framework of a condition monitoring or during a repair or exchange of parts of the motor, whereby the motor control device can take these equivalent circuit parameters into consideration for optimization, adjustment and monitoring of the motor. Thus, a "universal" motor control device can be created that can adapt itself in an adaptive manner to an entire series of different asynchronous motors, whereby an identification of the electrical magnitudes can be performed in the motor standstill. Changes in the motor that are conditioned by age can be taken into account by an adaptive correction of the regulator parameters and erroneous functions of the motor or of the monitoring of the motor control can be recognized.

Finally, a coordinate aspect of the invention suggests a usage of the previously cited method for the determination, optimization and monitoring of motor regulating parameters for the control and/or regulation of electrical drives, in particular for the adjusting of regulating parameters of a motor control device or motor regulating device. It is suggested in this aspect that the determined equivalent circuit parameters are used for regulation optimization, parameterization and monitoring. A determination of the equivalent circuit parameters can be carried out, for example, for a construction series of asynchronous motors once on a pattern motor and corresponding regulating parameters can be optimized and adapted for the motor control devices used for this purpose. This can take place in the workshop. If an identification apparatus is provided or can be externally connected in a motor control device, this device can perform a new identification of the parameters in the assembled state of the motor upon the first startup, during repair measures or in routine or running monitoring of the status (condition monitoring). To this end parts of the method such as the frequency range transformation and the determination of parameters can be carried out on an external computer and other parts such as, for example, the supplying of the test signal and the conversion of the three-phase system into the two coordinate system are carried out in the motor control device. However, it is decisive that the identified equivalent circuit parameters can be used for the optimal regulator parameterization, filter adjustment and electrical dimensioning of structural parts.

DRAWINGS

Further advantages result from the following description of the drawings. Exemplary embodiments of the present invention are shown in the drawings. The drawings, specification and the claims contain numerous features in combination. The person skilled in the art will consider the features even individually in a purposeful manner and combine them to logical further combinations.

The figures show by way of example:

Figure 3:
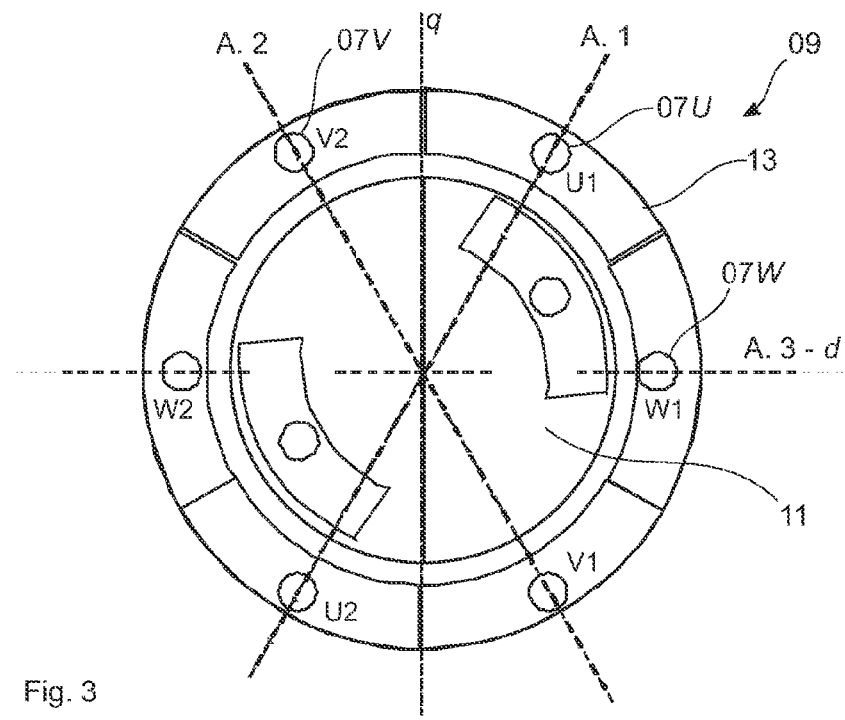
Figure 4:
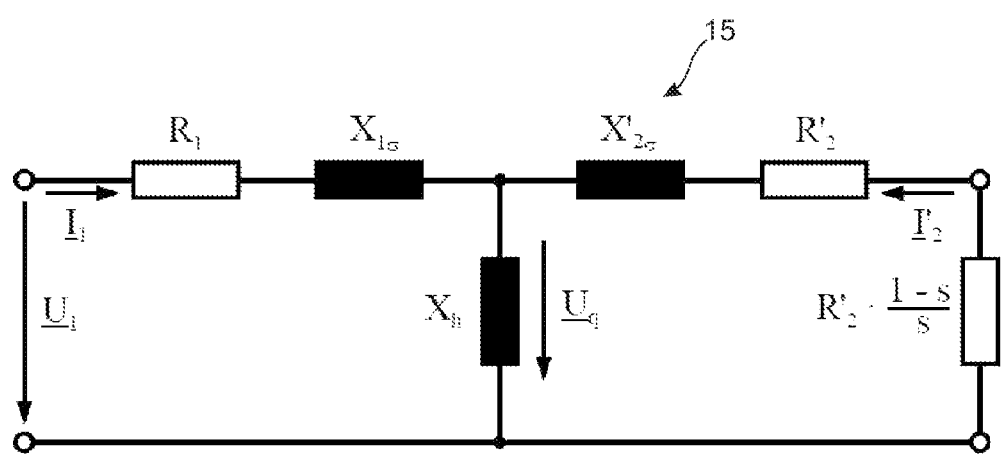
Figure 5:
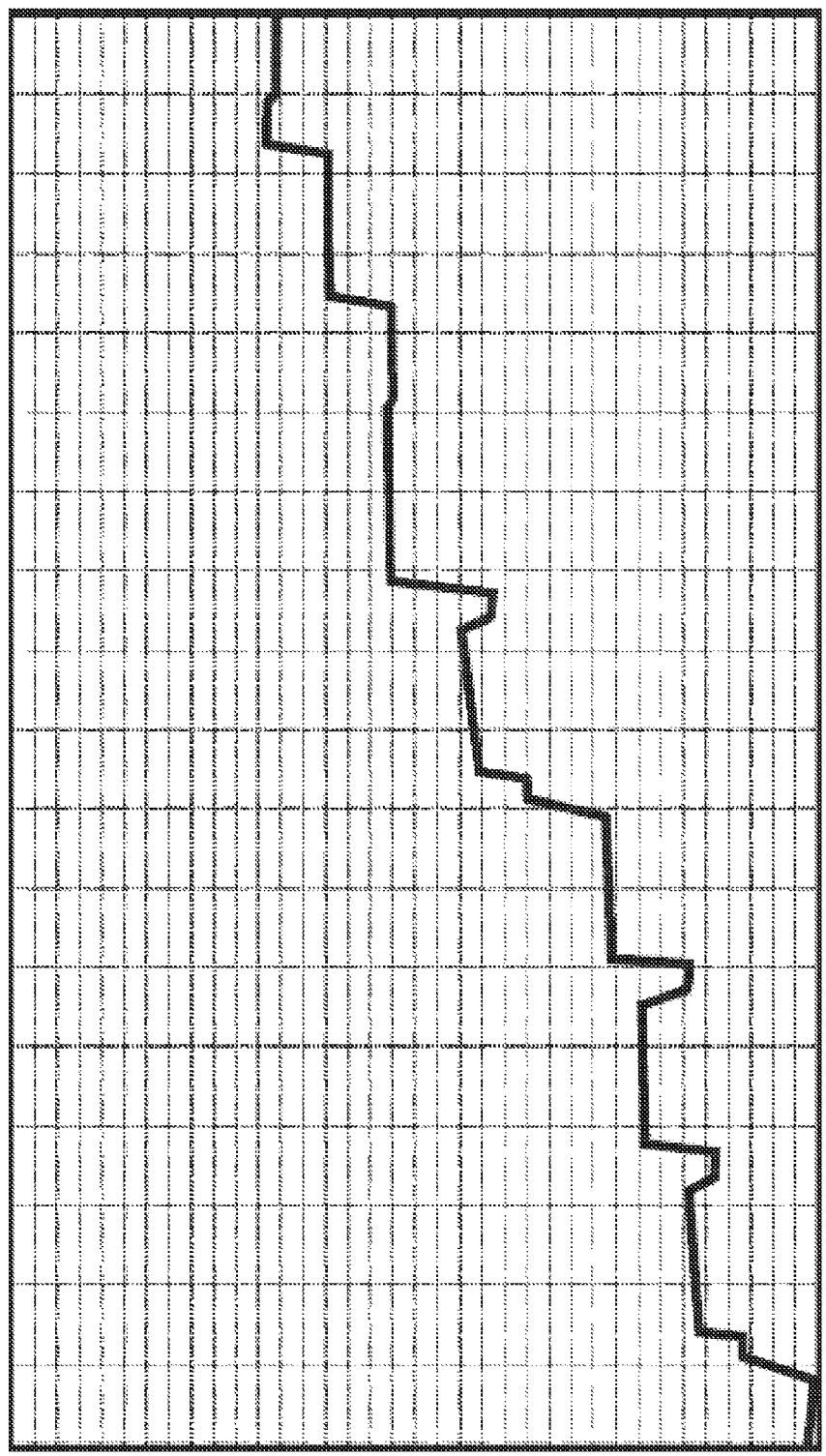
Figure 6:
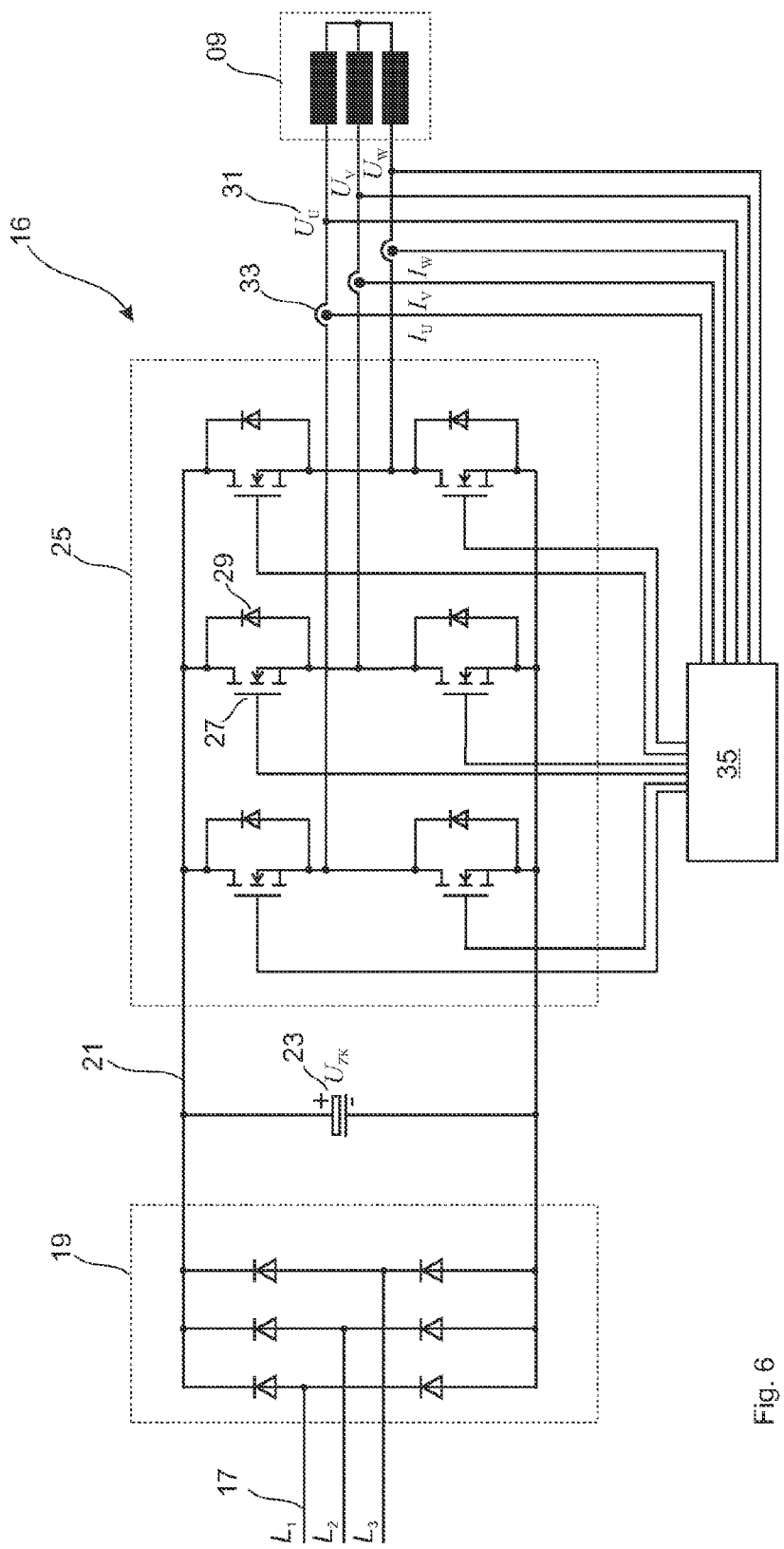
Figure 7:
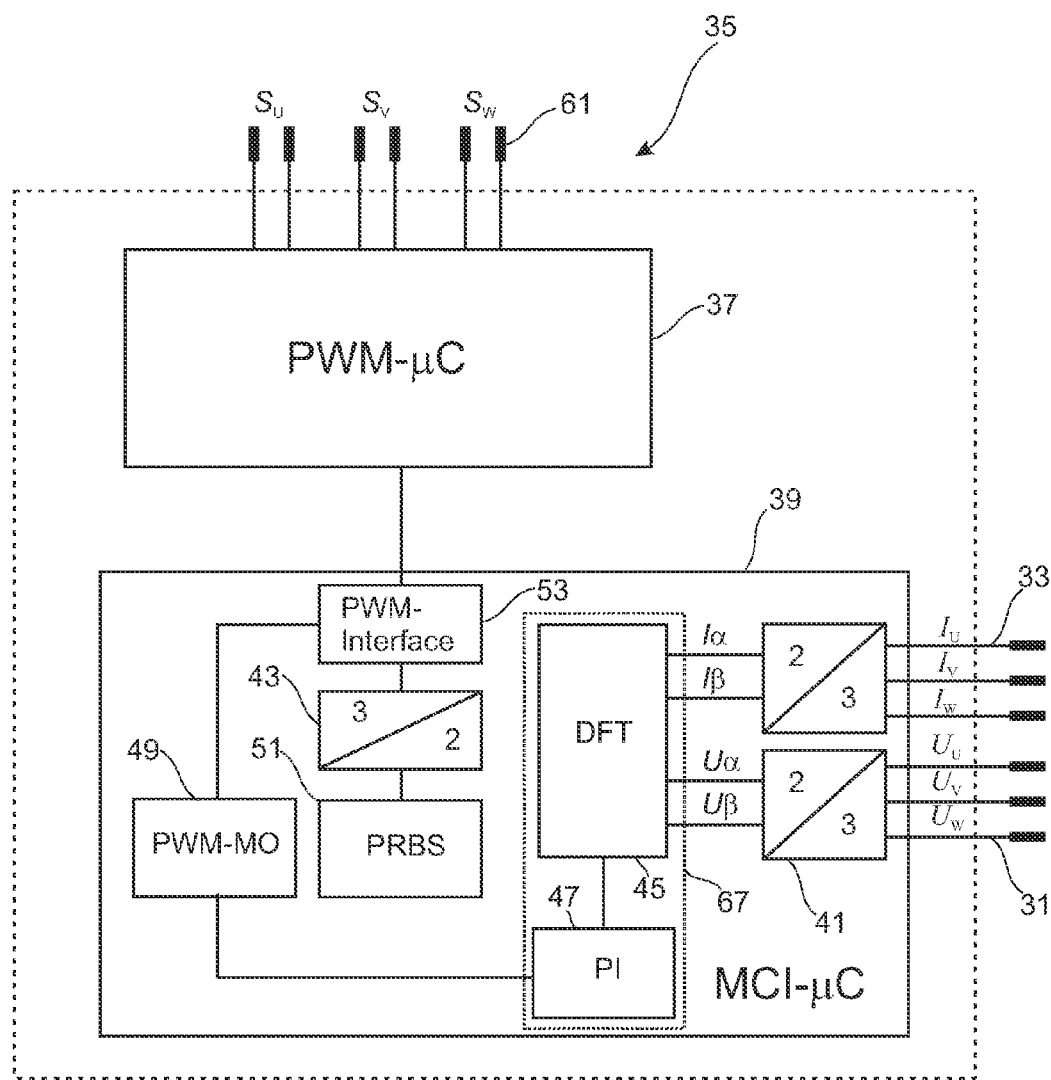
Figure 8:
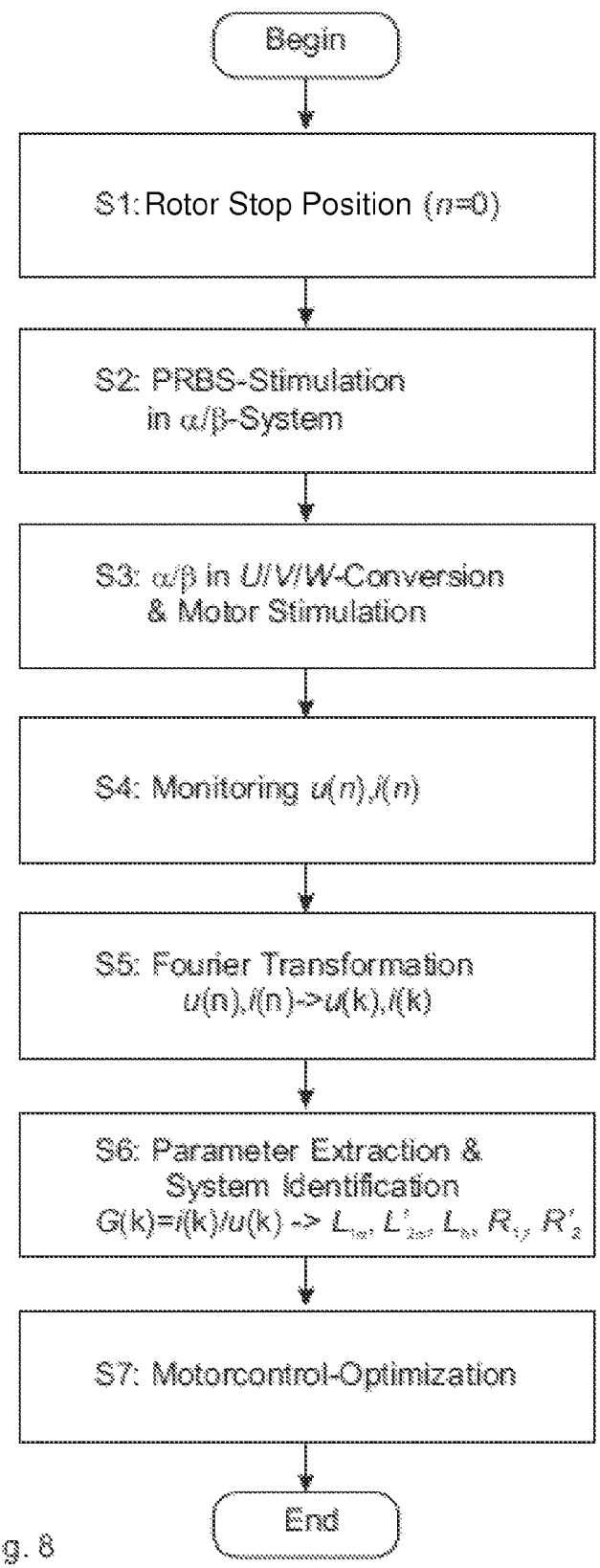
Figure 9:
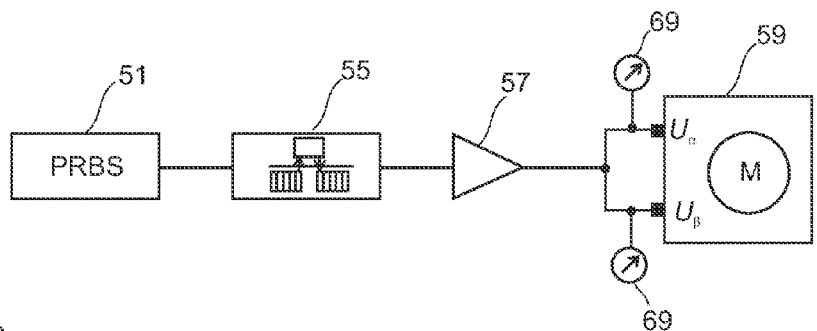
Figure 10:
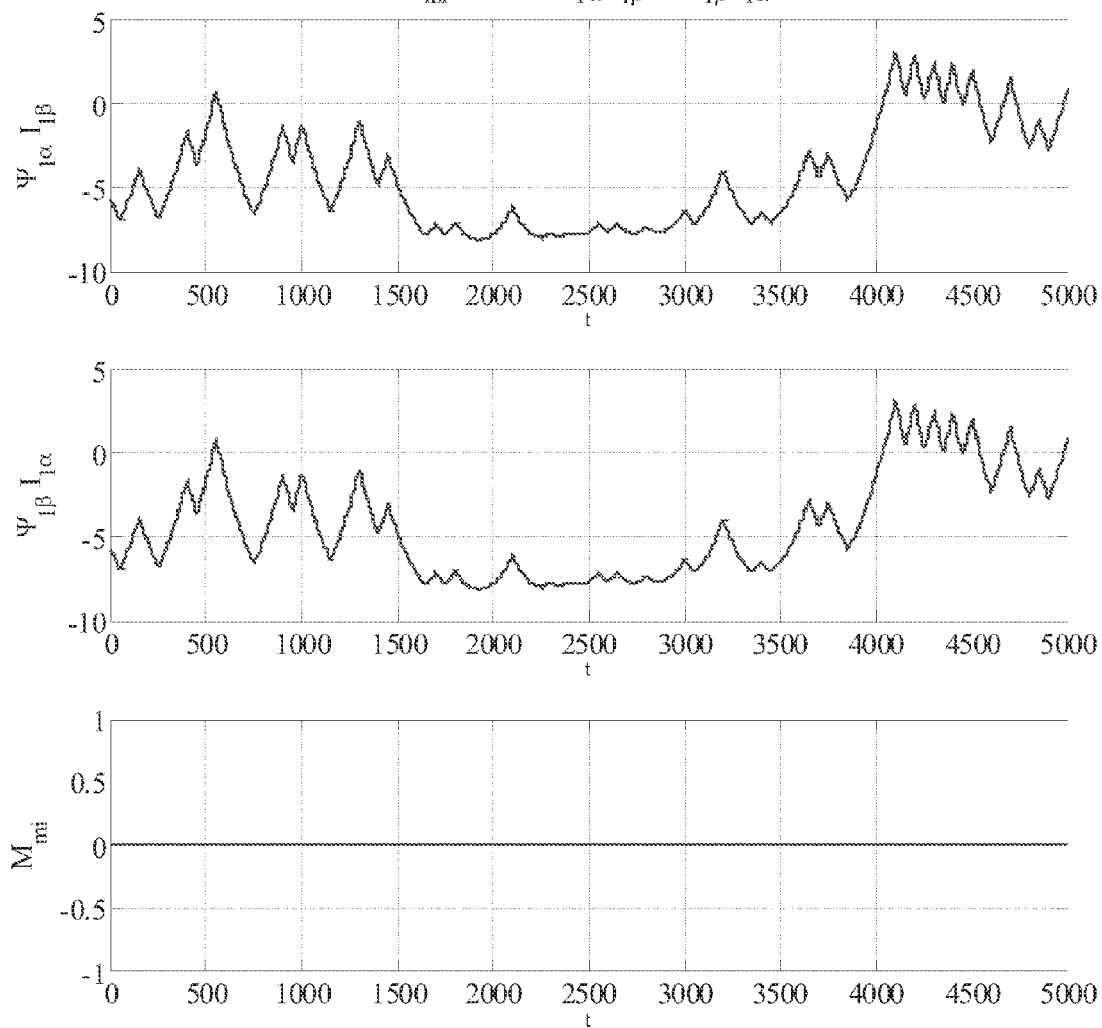
Figure 11:
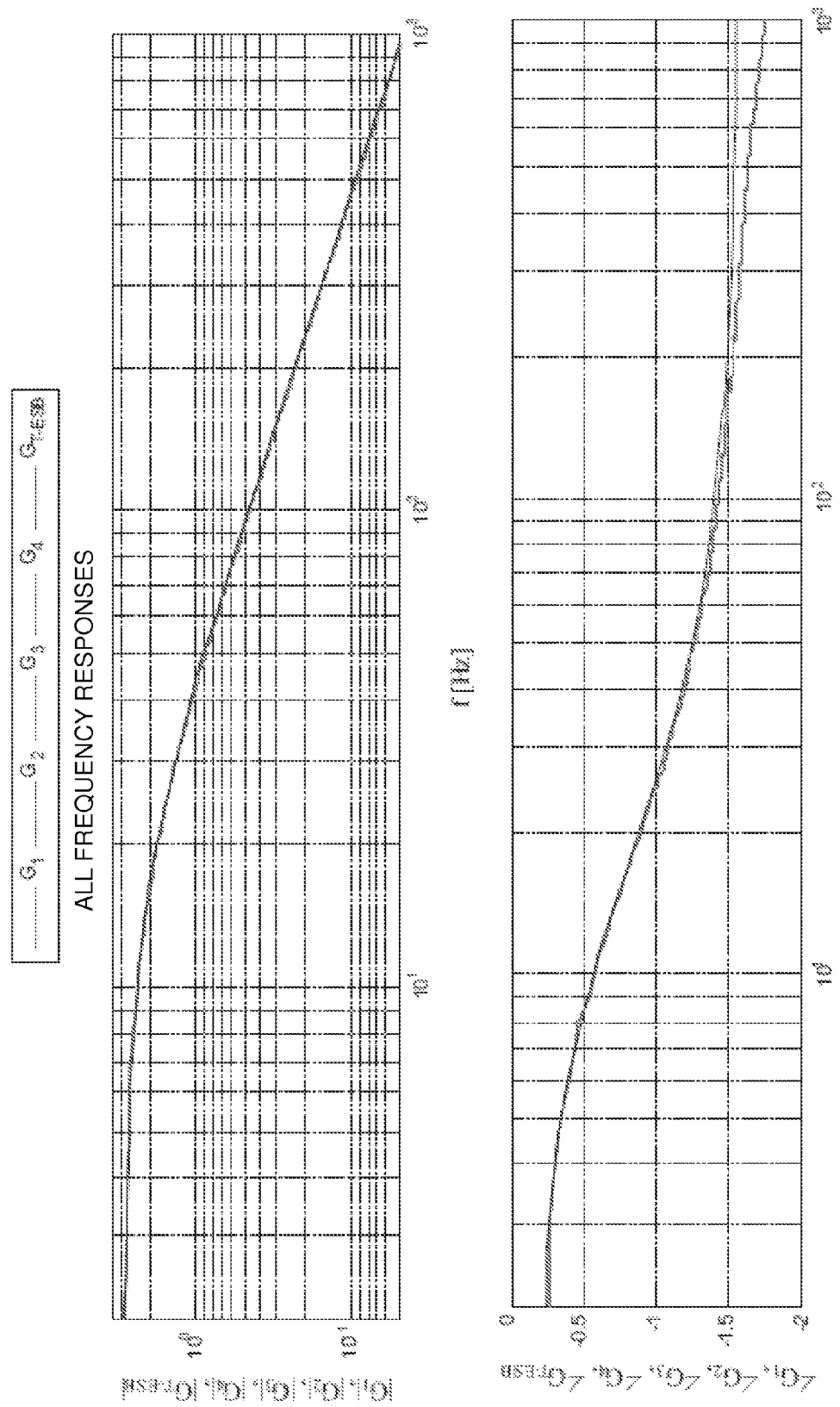
Figure 12:
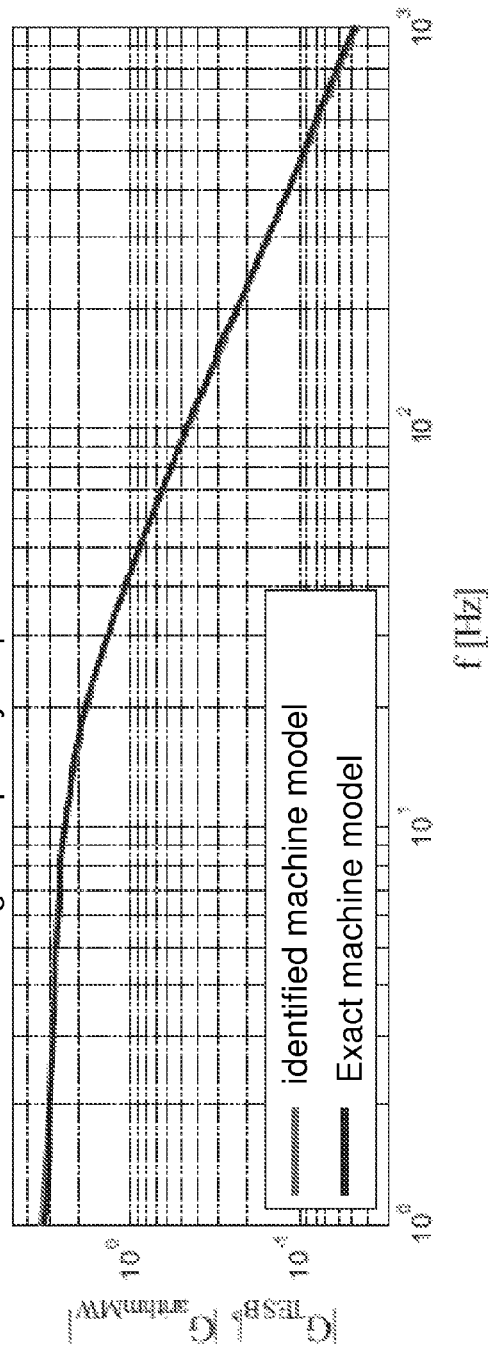
Figure 12:
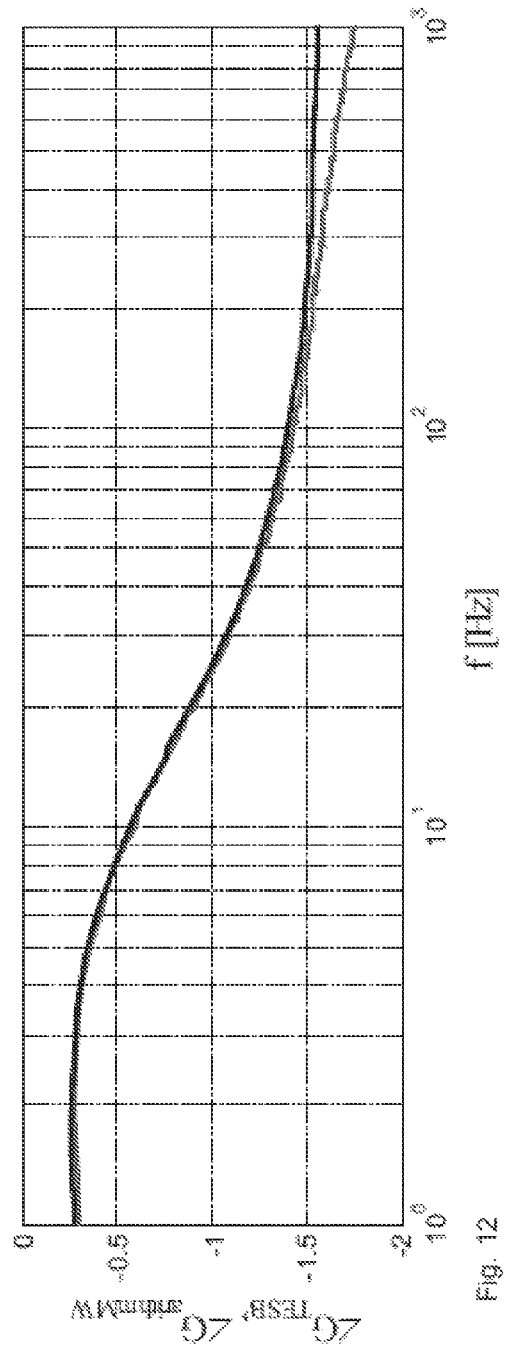
Figure 13:
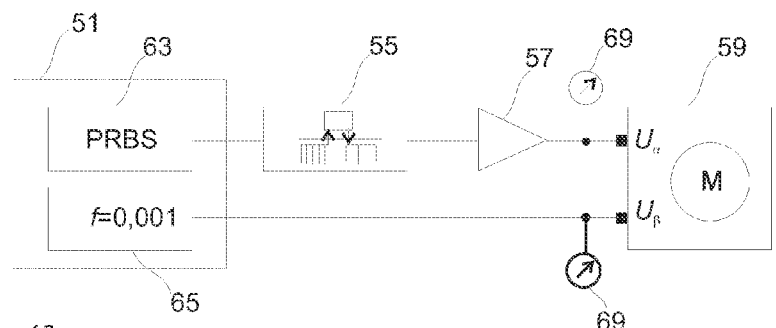
Figure 14:
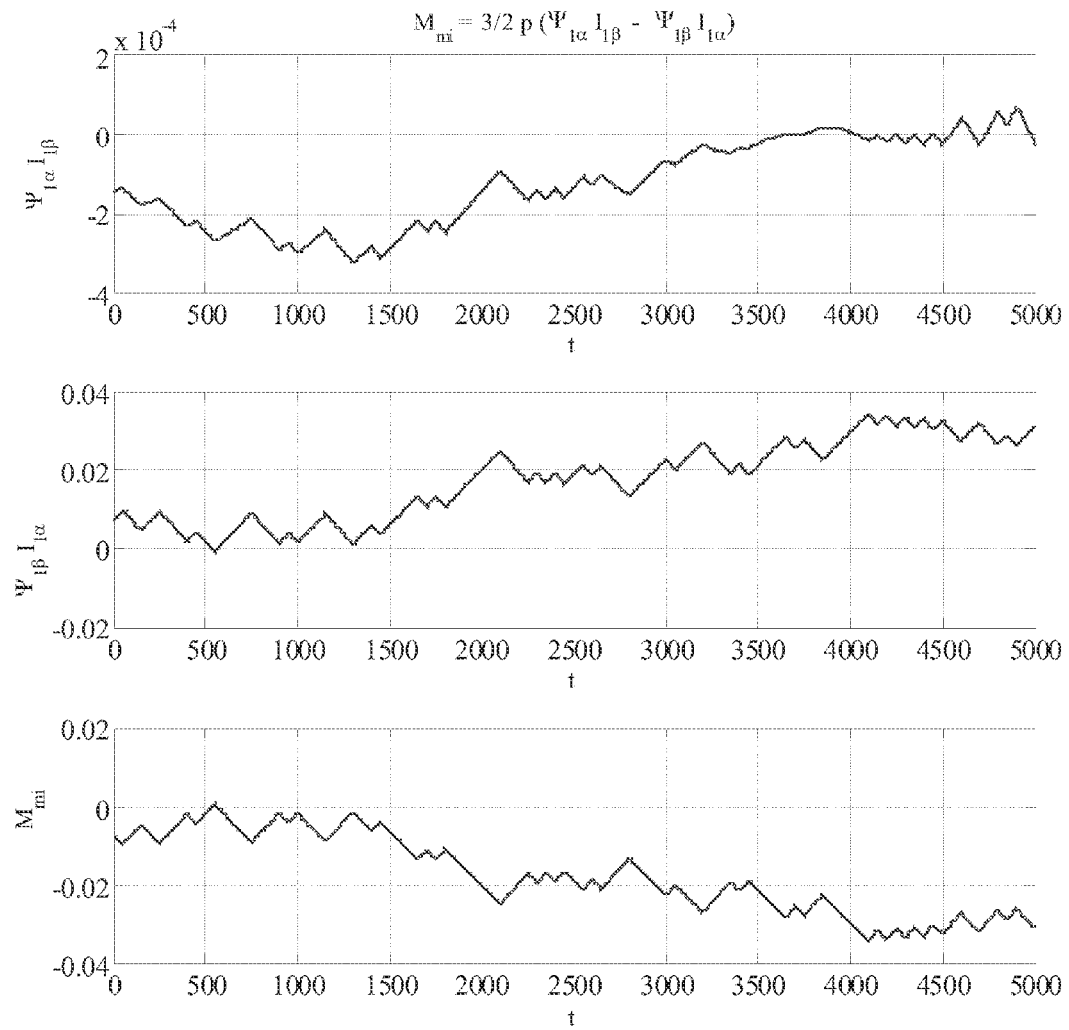
Figure 15:
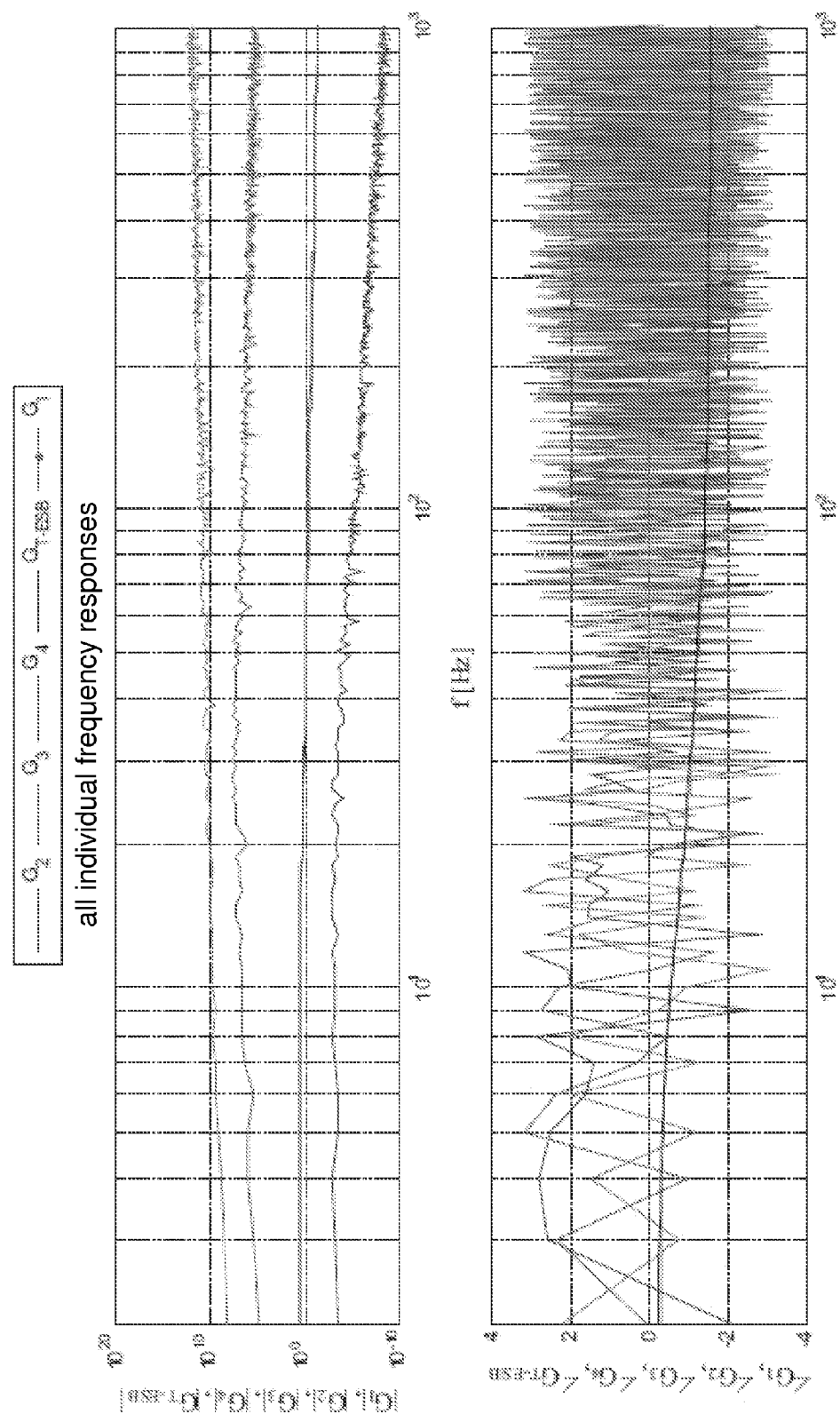

FIG. 3 schematically shows a construction of an asynchronous motor with squirrel-cage rotor;

FIG. 4 shows a T-equivalent circuit of an asynchronous motor;

FIG. 5 shows rotary motor movements in the identification of equivalent circuits in accordance with the state of the art;

FIG. 6 shows a first exemplary embodiment of a motor control device of the invention;

FIG. 7 shows exemplary embodiment of a motor control device in accordance with the invention;

FIG. 8 shows an operating sequence of an exemplary embodiment of a method in accordance with the invention;

FIG. 9 schematically shows an exemplary embodiment of a test signal feed into a mathematical model of an asynchronous motor;

FIG. 10 shows torque courses according to the currents $I_\alpha$ and $I_\beta$ when using an exemplary embodiment of the method of the invention;

FIG. 11 shows an amount phase course of an admittance from measured time range data when using a method in accordance with the invention;

FIG. 12 shows a comparison of a measured and exact machine model when using a method in accordance with the invention;

FIG. 13 schematically shows an asymmetric test signal feed into a mathematical model of an asynchronous motor;

FIG. 14 shows torque amounts based on the asymmetrically supplied currents $I_\alpha$ and $I_\beta$ when supplying according to FIG. 13;

FIG. 15 shows a transmission function-parameter extraction during an asymmetrical supplying according to FIG. 13.

EMBODIMENTS OF THE INVENTION

In the figures the same or similar components are designated with the same reference numbers.

Figure 1:
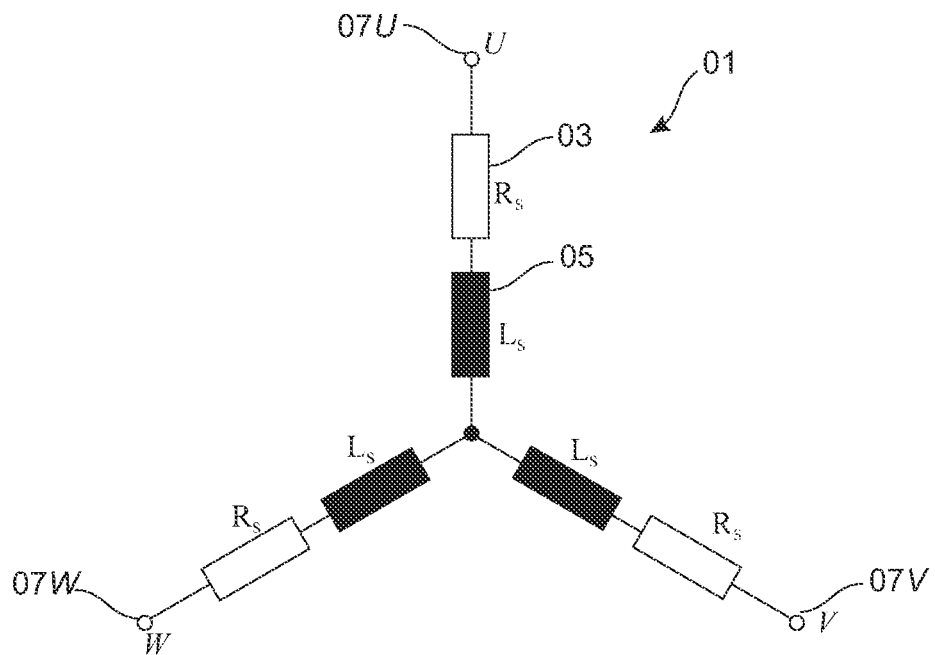
FIG. 1 shows an equivalent circuit of a stator coil of an asynchronous motor in a star connection.

In order to explain the invention FIG. 1 shows an equivalent circuit of the stator coil 01 03-phase motor. Each coil strand U, V and W comprises a coil resistor $R_s$ 03 and a coil inductivity $L_s$ 05. The three coil strands 07 are connected to each other at their first end and at their second end to the three phases U, V, W of the output of an inverter. Stator coil 01 integrates with the rotatably mounted rotor coil 11 in which a voltage is induced upon the impression of a rotating magnetic field stator coil 1 which voltage generates an oppositely directed rotor magnetic field by which the motor is put in rotation. The speed of the rotor 11 lags behind the magnetic rotary speed stator coil 01, as a result of which voltage continues to be introduced into the rotor 11. The degree of the lag is designated as slip s. The system of rotor coil 11 and stator coil 01 can be considered, instead of in a three-phase system U/V/W, in a stator two-coordinate system α/β or rotor two coordinate system d/q, from which the T-equivalent circuit of the motor shown in FIG. 4 can be derived.

Figure 2:
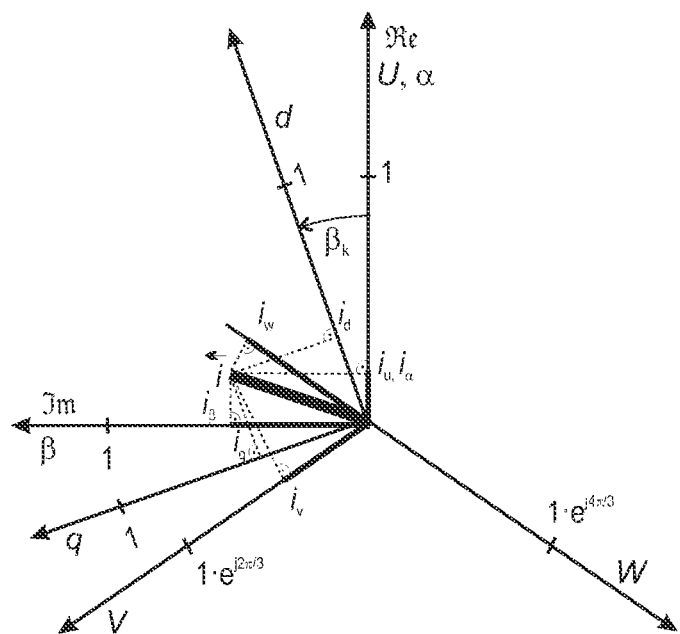
FIG. 2 shows a view of the connection between two-component- and three-phase coordinate systems.

To this end FIG. 2 at first shows the spatial association of the three-phase system U/V/W with three coordinate directions 1 (0°), $e^{j2\pi/3}$ (120°) and $e^{j4\pi/3}$ (240°) compared to the α/β coordinate system of the complex plane with real part and imaginary part. Under the assumption of a total current I the latter can be divided relative to the three-phase system into three partial currents $I_U$, $I_V$ and $I_W$. In the same manner the current can be expressed by the partial currents in complex stator-fixed coordinate systems $I_\alpha$ und $I_\beta$. The relationship between $I_\alpha$ und $I_\beta$ and $I_U$, $I_V$ and $I_W$ has already been indicated further above. When using the complex representation $I_\alpha$ und $I_\beta$, which indicate the stationary stator axis directions and the three phase currents $I_U$, $I_V$ and $I_W$, the above transformation specifications can be derived. The rotor has a rotating coordinate system d/q that comprises the rotor flux axis d and transverse flux axis q. The association between the rotating coordinates d/q and the stationary coordinates α/β can be established by the rotor angle of rotation $β_k$.

FIG. 3 schematically shows the construction of a three-phase asynchronous motor 09. This motor comprises in a simple embodiment a three-phase stator 13 with the coil strands U1, U2 (07-U), V1, V2 (07-V) and W1, W2 (07-W). The stationary stator coils define three coil axes A1, A2 and A3 that correspond to the three phase axes 1, $e^{j2π/3}$ and $e^{j4π/3}$. Rotor 11 comprises a squirrel-cage rotor in which a voltage is induced during a rotating stator magnetic field and whose induced current generates a countermagnetic field, as a result of which a torque of the motor 09 is produced.

Finally, FIG. 4 shows the equivalent circuit of the coupling of stator- and rotor coils to the phase currents $I_1$, $I_2$ and $U_1$, $U_2$, whereby the index 1 stands for the stator coil and the index 2 for the rotor coil. The equivalent circuit according to FIG. 4 is a T-equivalent circuit and describes the electrical connection between stator coil 01 with $R_1$, $L_{1σ}$ 03, 05 and main inductivity $L_h$ to rotor 11 and the effect of the rotor coil with $R'_2$ und $L'_{2σ}$ as well as also with main inductivity $L_h$. Based on the T-equivalent circuit, the following admittance function can be derived under the assumption of a slip=1:

$$G = Y = \frac{sL_2 + R'_2}{s^2(L_{1σ}L_2 + L_hL'_{2σ}) + s(L_1R'_2 + L_2R_1) + R_1R'_2}$$

The present invention now has the task of determining the equivalent circuit magnitudes $R_1$, $R'_2$, $L_{1σ}$, $L'_{2σ}$ and $L_h$. Starting from the knowledge of these equivalent circuit magnitudes when the voltages $U_α$, $U_β$ are supplied, the developing $I_α$, $I_β$ can be predicted, whereby desired speeds and torques can be optimized by adjusting the regulating parameters. A description of the transient behavior is essential here, whereby a single analysis of the electrical behavior of the motor supplies the most precise knowledge possible about the equivalent circuit parameters.

Short-circuit tests, no-load tests and direct current tests are known from the state of the art for identifying these equivalent circuit parameters. Thus, FIG. 5 shows in a motor control device b_maXX 5000 of the company Baumüller Nürnberg GmbH known from the state of the art the behavior of the rotor rotational angle φ over time in the identification of the previously-cited parameters with the aid of an implemented, pure time range method. The motor executes distinct mechanical movements here. If the motor is coupled to a mechanical driveline, the latter influences the rotor movement, so that the result is falsified. As a result, equivalent circuit parameters can not be determined in the assembled state of a motor. Furthermore, additional no-load- and short-circuit tests are necessary in order to gain an exact knowledge of the equivalent circuit parameters, whereby high mechanical and electrical loads of the motor can occur that can bring about damage or destruction of the motor.

FIG. 6 schematically shows a motor control circuit 16 in which the phases of a three-phase supply mains 17 are converted by a three-phase bridge rectifier 19 into a direct current of a DC intermediate circuit 21. A buffer capacitor 23 is provided in the DC intermediate circuit 21 which capacitor smoothes the voltage and, for example, in the case of a power failure can make puffer energy available for a regulated emergency travel operation of motor 09. An inverter 25 comprises three switching bridges in which power semiconductor switching elements 27 can switch the motor phases U/V/W in a coordinated manner opposite the direct voltage +DC and −DC of the intermediate circuit 21 and thus make available in a speed-variable manner a PWM-modelled control voltage $U_u$, $U_v$, $U_w$ for the three-phase motor 09. Each power semiconductor switching element 27, that can comprise an IGBT transistor, a power transistor or the like, is protected by a free-wheeling diode 29 against overvoltage, in particular inductive feedback by motor 09. The phase voltages $U_u$, $U_v$, $U_w$ 31 as well as phase currents $I_U$, $I_V$, $I_W$ 31 are tapped off in the supply lines to the three-phase motor 09 and supplied to a motor control device 35. The phase voltages do not necessarily have to be tapped off, since they can be given by the inverter 25 and it is assumed that the given theoretical voltage value is equal to the actual voltage value.

The motor control device 35 comprises control lines in order to control the individual power semiconductor switching elements 27 in accordance with the desired speed behavior of the motor 09 in the correct phase. In the case of the sensor-based regulation the motor control device 35 is furthermore coupled with angle position sensors and acceleration sensors, whereby even temperature sensors for monitoring the operating temperature of motor 09 can be connected. In the case of a field-oriented regulation without shaft encoder the motor control device 35 can carry out a speed-optimized control of the inverter switching component 27 solely with knowledge of the phase voltages 31 and measured phase currents 33. The regulating parameters of the motor control device 35 can be adjusted with knowledge of the electrical behavior of the motor 09, which can be described by the equivalent circuit shown in FIG. 4. To this end the motor control device 35 comprises an identification apparatus 39, like the one shown in FIG. 7.

FIG. 7 shows an exemplary embodiment of a motor control device 35 that comprises an identification apparatus 39 for the extraction of equivalent circuit parameters of the three-phase asynchronous motor 09. The motor control device 35 comprises inputs for detecting the three phase currents $I_U$, $I_V$ and $I_W$ 33 as well as the three phase currents $U_u$, $U_v$, $U_w$ of the three-phase motor 09, whereby a detection of only two phase voltages and phase currents suffices, since the third magnitude results according to Kirchhoff. Furthermore, the motor control device 35 comprises switching outputs 61 for outputting inverter switching signals for activating the power semiconductor switching elements 27 of the inverter 25. The phase-correct generation of the inverter switching signals 61 takes place by means of a PWM (Pulse-Width Modulation) microcontroller that constitutes an inverter control apparatus 37 in order to perform a regulation of the speed and of the torque of the three-phase motor 09 without sensors or also sensor-supported. The identification apparatus 39 receives the phase voltages 31 and phase currents 33 and comprises and α/β transformation unit 41, that converts the phase voltages and phase currents into the partial voltage $U_α$, $U_β$ as well as into partial currents $I_α$ and $I_β$ of the complex two-coordinate system. The converted phase voltages and phase currents are fed into a parameter identification unit 67 that comprises on the one hand a Fourier transformation means 45 and on the other hand a parameter extraction means 47. A Fourier transformation is used on the time range data of the phase voltages and phase currents so that this data can be present in the frequency range and that the above-defined admittance transmission functions $G_1$, $G_2$, $G_3$ or $G_4$ can be formed. Instead of the admittance function, coefficients of another transmission function, in particular impedance function or other appropriate electrical functional relationships can be taken as base and the parameters of interest can be determined on this basis. Starting from the courses of the transmission functions the parameter identification unit 67 of the parameter extraction means 47 can extract, given knowledge of the basic admittance description function, the coefficients to be identified from the courses of the curves. The equivalent circuit parameters $R_1$, $R'_2$, $L_{1\sigma}$, $L'_{2\sigma}$ and $L_h$ of the equivalent circuit shown in FIG. 4 can be determined from the above, and on their basis an optimization unit 49 that can perform a modulation of the motor as well as an optimization of parameter adjustments of the generation of pulse width, can generate control parameters as well as filter parameters for the parameterization, optimization and monitoring of the inverter control apparatus 37. The latter are forwarded to a PWM interface 53 and can therefore be transmitted to the inverter control apparatus 37 in order to make possible an optimal regulation of the asynchronous motor.

In the framework of the parameter extraction test signals are fed in that can be generated via a test signal generation unit 51. In this exemplary embodiment a pseudo-noise binary signal (PRBS) is generated as test signal that makes the noise signal available uniformly as $U_\alpha$, $U_\beta$ by a U/V/W transformation unit 43 and is distributed onto the three phase voltages $U_u$, $U_v$, and $U_w$. This input signal is forwarded to the inverter control apparatus 37 that accordingly controls the inverter 25 in such a manner that the motor 09 is supplied with current in accordance with the test signal.

FIG. 8 shows an exemplary embodiment of a program sequence plan for carrying out a method in accordance with the invention. In step S1 at first the rotor is brought into a standstill position in which the speed number n is equal to 0. In step S2 the supplying of the test signal as PRB signal is carried out equally in the $\alpha/\beta$ system in both channels, therefore not phase-shifted or with a negative sign. This is an essential prerequisite so that no torques of the rotor can occur. A conversion into the phase voltages $U_u$, $U_v$, $U_w$ is carried out from the $\alpha/\beta$ test signals and the motor is controlled with them. The controlled voltage signals U(n) as well as the measured current values I(n) are scanned in the time range and transferred by a Fourier transformation, in particular a DFT (Discrete Fourier Transformation) or FFT (Fast Fourier Transformation), using a Welch method, into the frequency range, i.e., in this case into the Laplace range, so that the frequency range values U(k), I(k) result. In the Laplace range a transmission function of the admittance can be represented as $$G(k)=I(k)/U(k),$$

that forms the starting basis for the parameter extraction. Given knowledge of the transmission function, a parameter extraction can be carried out by a system identification, for example, building on the Levenberg-Marquardt algorithm, in order to determine the transmission function coefficients $a_0$, $a_1$, $b_0$, $b_1$ and $b_2$ from the curve course. The values of the equivalent circuit parameters $R_1$, $R'_2$, $L_{1\sigma}$, $L'_{2\sigma}$ and $L_h$ can be derived from this and used for the optimization of load changes or torque changes and to adjust and design filter parameters for a filtering of motor currents or motor voltages. A parameterization of the inverter control apparatus 37 can be carried out with the knowledge of the equivalent circuit parameters of the electrical stretch, whereby a high dynamic range of the motor behavior can be achieved by optimization of the regulating behavior of the inverter control device as innermost regulator. Demanding regulating methods that go far beyond the possibilities of a conventional PI regulator of the asynchronous motor can be achieved here since a precise knowledge of the electrical machine parameters is present. In particular, the regulator parameters can be exactly adjusted for a state space regulator, dead-beat regulator or model sequence regulation.

FIG. 9 schematically shows the feeding of a test signal of a test signal generation unit 51 into a mathematical model of a three-phase motor 59 as $\alpha/\beta$ model in the framework of a Matlab-Simulink simulation. The test signal generation unit 51 generates a pseudo-noise binary signal that is made available in the cycle of an inverter control apparatus 37 that regularly operates with a 16 kHz cycle rate, i.e., 62.5 µs cycle duration. Since the $\alpha/\beta$ motor model 59 can be modeled with quasi-analog signals, a scanning raising unit 55 is interposed that generates a quasi-continuous test signal from the roughly scanned 16 kHz test signal. This quasi-continuous test signal is amplified by a test signal amplifier 57 and fed equidirectionally without phase shift and without sign change as motor voltage $U_\alpha/U_\beta$ into the $\alpha/\beta$ asynchronous motor model 59. A simulation takes place here with Matlab-Simulink in order to carry out a mathematical verification of the method. The occurring torques can be determined according to the formula $$M_{mi} = \frac{3}{2} p \mathcal{T}\{\vec{\Psi}_1^{s*} \vec{I}_1^{s}\}$$

$$M_{mi} = \frac{3}{2} p \mathcal{T}\{(\Psi_{1\alpha} + j\Psi_{1\beta})^* \cdot (I_{1\alpha} + jI_{1\beta})\}$$

$$M_{mi} = \frac{3}{2} p (\Psi_{1\alpha} I_{1\beta} - \Psi_{1\beta} I_{1\alpha}).$$

Starting from the numeric simulation, the courses of the phase currents and the magnetic interlinkage of the two parts of the above torque calculation specification are recorded by a signal recording unit 69, which yields a resulting torque of 0. It can accordingly be deduced that in the case of the initial equations at the base of the method an idle, torque-free rotor can be expected given an equidirectional supplying of the test signal.

FIG. 11 shows an amount- and phase course via a frequency range of 0-1 kHz with the admittance function $G=\overline{Y}$ that was derived from the identified electrical system and from the exact machine model. It can be clearly recognized that the transmission functions $G_1$ to $G_4$ coincide almost identically with the exact machine model. Starting from the scanned phase voltages and phase currents measured in the time range, an almost identical system characterization of the electrical behavior of the three-phase motor 09 can be derived.

FIG. 12 again shows an amount- and phase course of an averaged machine model that averages the combined amount- and phase courses of the individual transmission functions $G_1$ to $G_4$ compared to the exact machine model. Slight deviations result in the phase course only in the uppermost frequency range in the vicinity of 1 kHz, whereby the amount course |G| perfectly coincides. For this reason it is advantageous to determine all four transmission functions $G_1$ to $G_4$ and to carry out an optionally weighted averaging in order to compensate any errors, for example, inexactitudes in the Fourier transformation or parameter extraction.

As a counterexample to a symmetrical feeding in, FIG. 13 shows the feeding of a test signal of a test signal generation unit 51 only into the $\alpha$-channel, whereas an almost constant direct voltage signal is fed into the $\beta$-channel. To this end the test signal generation unit 51 comprises an $\alpha$-test signal generation means 63 and $\beta$-test signal generation means 65. The $\alpha$-test signal generation means 63 generates a pseudo-noise binary signal that is made available with a typical cycle frequency of an inverter control apparatus 37 with 16 kHz and is transformed by a scanning rate raising unit 55 to a quasi-time-continuous signal, whereby an amplification of the signal by means of a test signal amplifier 57 follows. The course in time of the test signal and of the signal currents is determined by a signal recording unit 69. The PRB signal is fed as voltage $U_\alpha$ into the mathematical model of the three-phase motor 59. The β-test signal generation means 65 generates a constant voltage in parallel to it that is fed as $U_\beta$ into the model of the three-phase motor 59.

FIG. 14 shows the two partial products of the torque equation as well as the total torque with which the rotor is driven. It can be clearly recognized that in the case of an asymmetric supplying of the test signals a torque is generated that puts the rotor 11 in rotation, whereby in this case a parameter identification would also be a function of the type of the mechanical drive line. Finally, FIG. 15 shows the evaluation of the transfer function or admittances $G_1$ to $G_4$ that each supplies totally different values, whereby the phase- and amount courses are practically unusable. Thus, it has been presented that only an equidirectional feeding in of the test signal in both coordinate directions α and β of the motor 09 leads to utilizable results.

The basic idea of the invention is based on a signal-theoretical consideration of a three-phase electromotor in a two-coordinate space α/β, whereby evaluation signals present as motor currents can be transformed by symmetrically feeding a broadband test signal, preferably a PRB signal, into the frequency range, preferably by a Welch method. Building on this, transfer functions can be extracted from the fed-in and measured signals and the basic system description parameters can be evaluated by a parameter identification method, preferably a Levenberg-Marquardt algorithm. Given knowledge of the formula connection of the transfer function, the individual function parameters can be identified and therewith the electrical behavior of the motor characterized. The invention places particular emphasis on the special supply type, the structure of the transfer function and the analysis specification in which a determination of the electrical equivalent circuit magnitudes is made possible at a standstill of the rotor. The method illustrates the transient behavior of the motor over a large working frequency range and/or speed range and can be used to adjust, optimize and monitor the motor. In particular when used in a motor control device, a universal motor control device can be made available and can be adaptively used in the workshop or after the assembly of the motor when coupled to a mechanical output line for determining the motor behavior. This makes possible a determination of the parameters describing the machine which is rapid and protects the motor. The method can be retrofitted using software technology into existing motor control devices such as, for example, the Baumüller b_maXX motor controls and servoregulators, in particular the b_maXX 1000-5000 and opens up an automated identification and monitoring of the parameters describing the motor.

LIST OF REFERENCE NUMERALS 01 stator coils equivalent circuit of an asynchronous motor
03 coil resistor
05 coil inductivity
07 U/V/W coil strand
09 asynchronous motor
11 rotor with short circuit coil
13 stator
15 equivalent circuit of a stator coil of an asynchronous motor
16 motor control circuit
17 AC supply mains
19 three-phase bridge rectifier
21 DC intermediate circuit
23 buffer capacitor
25 inverter
27 power semiconductor switching element
29 free-wheeling diode
31 phase voltage
33 phase current
35 motor control device
37 inverter control apparatus
39 identification apparatus
41 α/β transformation unit
43 U/V/W transformation unit
45 Fourier transformation means
47 parameter determination means
49 optimization unit
51 test signal generation unit
53 inverter control interface unit
55 scan rate raising unit
57 test signal amplifier
59 α/β asynchronous model
61 inverter switching signals
63 α test signal generation means
65 β test signal generation means
67 parameter identification unit
69 signal recording unit

The invention claimed is:

1. A method for the identification of electrical equivalent circuit parameters (03, 05, 15) of a three-phase asynchronous motor (09) without a shaft encoder,
comprising at least the steps:
taking the rotor to a standstill position (11);
infeeding identical test signal voltage feed $U_{1\alpha}$, $U_{1\beta}$ in α and β in the stator axis direction of the asynchronous motor (09);
measuring signal currents $I_{1\alpha}$, $I_{1\beta}$ of the α and β axial direction of the asynchronous motor (09);
identifying equivalent circuit parameters (03, 05, 15) of the asynchronous motor (09) on the basis of the test signal voltages $U_{1\alpha}$, $U_{1\beta}$ and of the measuring signal currents $I_{1\alpha}$, $I_{1\beta}$;
whereby the test signal feed into the asynchronous motor (09) takes place in such a manner that the rotor (11) remains torque-free.

2. The method according to claim 1,
characterized in that
frequency functions $G_1 = I_{1\alpha}/U_{1\alpha}$ $G_2 = I_{1\beta}/U_{1\alpha}$ $G_3 = I_{1\alpha}/U_{1\beta}$ $G_4 = I_{1\beta}/U_{1\beta}$ are determined for the identification of equivalent circuit parameters (03, 05, 15), whereby predeterminable deviations of the frequency response functions bring about a repetition of the method or an error signal.

3. The method according to claim 2, characterized in that the test signal is a pseudo-noise binary signal.

4. The method according to claim 2, characterized in that the identification of the equivalent circuit parameters (03, 05, 15) comprises a Fourier transformation of time-discrete signals according to a Welch method.

5. The method according to claim 2,
characterized in that the identification of the equivalent circuit parameters (03, 05, 15) comprises a transmission function-parameter determination, in particular according to a Levenberg-Marquardt algorithm.

6. The method according to claim 2, characterized in that the identified equivalent circuit parameters (03, 05, 15) are used in an adjustment or optimization of inverter control parameters or for motor monitoring.

7. An identification apparatus (39) for the identification of electrical equivalent circuit parameters (03, 05, 15) of a three-phase asynchronous motor (09) without a shaft encoder, the apparatus including an inverter interface unit (39) that can be connected to an inverter control apparatus (37) for controlling communication and for fixing rotor standstill, characterized in that the identification apparatus (39) furthermore comprises a test signal generation apparatus (51) for generating a two channel, identical α/β-test signal configured to keep the rotor torque-free when fed into the asynchronous motor, a U/V/W-transformation unit (43) for the transformation of the α/β-test signal into a U/V/W control test signal, an α/β transformation unit (41) for the transformation of measured U/V/W measured signal currents into α/β measured signal currents and a parameter identification unit (67) for the identification of equivalent circuit parameters (03, 05, 15).

8. The apparatus according to claim 7,
characterized in that
the parameter identification unit (67) comprises a Fourier transformation means (45), that comprises an FFT/DFT means for the Fourier transformation of discontinuous α/β-scanning signal values according to a Welch method and comprises a parameter determination means (47), that comprises a Levenberg-Marquardt transmission function-parameter determination means.

9. The apparatus according to claim 7,
further comprising
a monitoring and optimization unit that is set up to determine, optimize or monitor control parameters of an inverter control apparatus (37) on the basis of the identified equivalent circuit parameters (03, 05, 15).

10. A motor control device (35) for controlling a three-phase asynchronous motor (09), and comprising:
(a) an identification apparatus (39) for the identification of electrical equivalent circuit parameters (03, 05, 15) of a three-phase asynchronous motor (09) without a shaft encoder, the identification apparatus including an inverter interface unit (39) that can be connected to an inverter control apparatus (37) for controlling communication and for fixing rotor standstill, the identification apparatus (39) furthermore comprising a test signal generation apparatus (51) for generating a two channel, identical α/β-test signal configured to keep the rotor torque-free when fed into the asynchronous motor, a U/V/W-transformation unit (43) for transformation of the α/β-test signal into a U/V/W control test signal, an α/β transformation unit (41) for transformation of measured U/V/W measured signal currents into α/β measured signal currents and a parameter identification unit (67) for identification of equivalent circuit parameters (03, 05, 15), whereby the identified equivalent circuit parameters (03, 05, 15) can be used for determination, optimization and monitoring of the motor (09) or of the motor control.

11. The apparatus according to claim 10,
characterized in that
the apparatus is arranged in such a manner that an automated identification of the equivalent circuit parameters (03, 05, 15) during a rotor standstill can be carried out at least during the first startup whereby an error signal can be initiated upon a demonstrable deviation of the identified equivalent circuit parameters (03, 05, 15) from previously determined, stored or model-related equivalent circuit parameters (03, 05, 15).

12. The use of a method according to claim 1 for the determination, optimization and monitoring of motor regulator parameters for the control of electrical drives, for the adjusting of regulating parameters of a motor control device (35).

* * * * *